US012740065B2

(12) United States Patent
Tang et al.

(10) Patent No.: US 12,740,065 B2
(45) Date of Patent: Sep. 15, 2026

(54) NON-VOLATILE MEMORY HAVING A VERTICAL CHANNEL REGION AND A GATE STRUCTURE

(71) Applicant: Shanghai Huali Microelectronics Corporation, Shanghai (CN)

(72) Inventors: Maoyuan Tang, Shanghai (CN); Meng Zhou, Shanghai (CN); Jiahui Tan, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 344 days.

(21) Appl. No.: 18/631,225

(22) Filed: Apr. 10, 2024

(65) Prior Publication Data

US 2025/0089259 A1 Mar. 13, 2025

(30) Foreign Application Priority Data

Sep. 11, 2023 (CN) ......................... 202311167130.X

(51) Int. Cl.
*H10B 43/35* (2023.01)
*H10B 43/27* (2023.01)

(52) U.S. Cl.
CPC ............. *H10B 43/35* (2023.02); *H10B 43/27* (2023.02)

(58) Field of Classification Search
CPC ............ G11C 16/0408; G11C 16/0433; G11C 16/0466; H10B 41/27; H10B 41/35; H10B 43/27; H10B 43/35; H10B 43/50; H10D 30/0413; H10D 30/6891; H10D 30/6892; H10D 30/69; H10D 30/693; H10D 30/696
See application file for complete search history.

(56) References Cited

U.S. PATENT DOCUMENTS

2002/0109138 A1* 8/2002 Forbes ................. G11C 29/789 257/E29.302

* cited by examiner

*Primary Examiner* — Cheung Lee
(74) *Attorney, Agent, or Firm* — Banner & Witcoff, Ltd.

(57) ABSTRACT

This application discloses a non-volatile memory. A device unit structure includes a vertical channel region and a gate structure. The gate structure covers one side surface of the vertical channel region. The gate structure includes a selection gate and a storage gate. The selection gate and the vertical channel region are spaced apart by a first gate dielectric layer. The selection gate and a semiconductor substrate are spaced apart by a first dielectric layer. The storage gate is located at a top of the selection gate, and the storage gate and the selection gate are spaced apart by a second dielectric layer. The storage gate and the vertical channel region are spaced apart by a second gate storage dielectric layer. A surface of the vertical channel region covered by the gate structure is used for forming a vertical channel. A second vertical channel part is controlled by the storage gate.

15 Claims, 1 Drawing Sheet

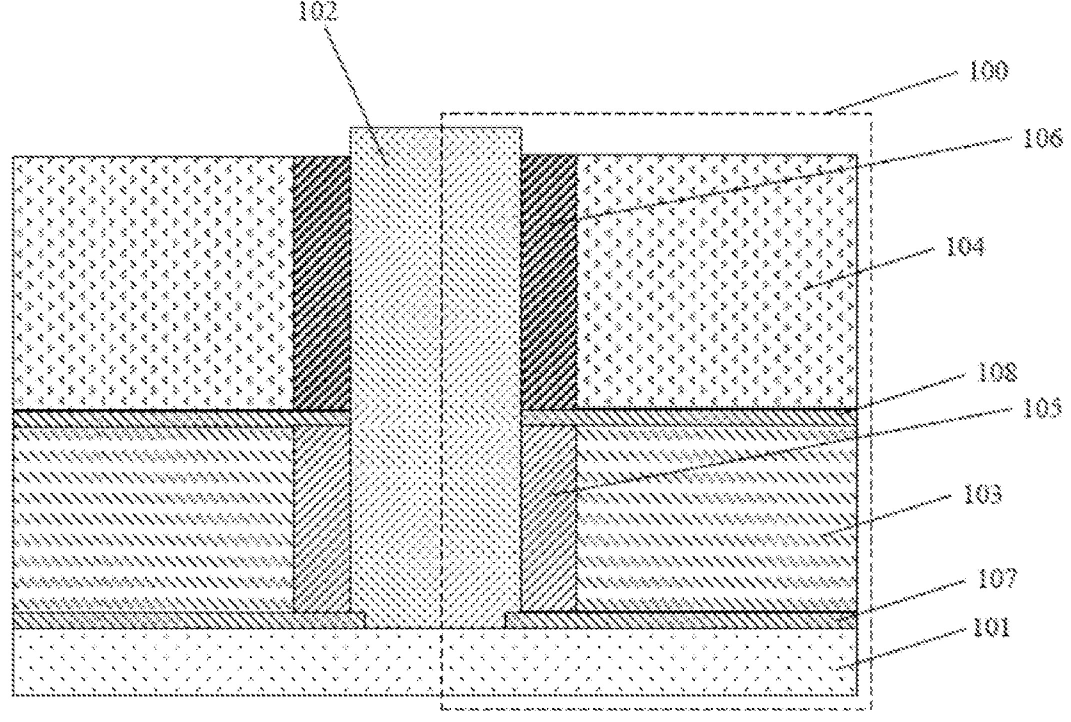
102
100
106
104
108
105
103
107
101

NON-VOLATILE MEMORY HAVING A VERTICAL CHANNEL REGION AND A GATE STRUCTURE

CROSS-REFERENCE TO RELATED APPLICATIONS

This application claims the priority to Chinese patent application No. 202311167130.X, filed on Sep. 11, 2023, the disclosure of which is incorporated herein by reference in its entirety.

TECHNICAL FIELD

This application relates to a semiconductor integrated circuit, in particular to a non-volatile memory.

BACKGROUND

Existing non-volatile memories store charges in strictures such as floating gates (FGs) and nitride layers of silicon-oxide layer-nitride layer-oxide layer-silicon (SONOS). With the development of Moore's Law, these existing non-volatile memories face problems such as size reduction and various reliability problems. Researchers have developed various materials and structures to try to solve memory bottlenecks.

The existing non-volatile memories are all one-dimensional structures, such as one-dimensional NOR flashes or one-dimensional e-flashes. The working principle of the one-dimensional non-volatile memories is to open a horizontal channel to allow current to flow and express '1' or '0' by the number of charges stored in the floating gate or SONOS. The working voltage is required to be greater than 5V, and the programming/erasing speed is relatively slow.

However, if a simple one-dimensional single-layer device structure is extended to a two-dimensional stereoscopic space, there are various problems such as insufficient size scaling ability, high power consumption, and poor stability and reliability. For example, V2T NOR flashes have such problems.

BRIEF SUMMARY

According to some embodiments in this application, a device unit structure of the non-volatile memory provided in this application includes a vertical channel region and a gate structure;

- the vertical channel region is composed of a first epitaxial layer formed on a top surface of a semiconductor substrate, and the vertical channel region is doped in a second conductive type;
- the gate structure covers one of two side surfaces of a width side of the vertical channel region;
- the gate structure includes a selection gate and a storage gate;
- the selection gate and the vertical channel region are spaced apart by a first gate dielectric layer, and the selection gate and the semiconductor substrate at a bottom are spaced apart by a first dielectric layer;
- the storage gate is located at a top of the selection gate, and the storage gate and the selection gate are spaced apart by a second dielectric layer;
- the storage gate and the vertical channel region are spaced apart by a second gate storage dielectric layer, the second gate storage dielectric layer has a charge storage function and forms a storage bit, and the second gate storage dielectric layer is located at a top of the first gate dielectric layer;
- a surface of the vertical channel region covered by the gate structure is used for forming a vertical channel, the vertical channel is composed of a first vertical channel part and a second vertical channel part, the first vertical channel part is controlled by the selection gate, and the second vertical channel part is controlled by the storage gate; in a case that charges are stored in the second gate storage dielectric layer, the storage bit is '0' and the second vertical channel part is disconnected; in a case that the charges stored in the second gate storage dielectric layer are erased, the storage bit is '1' and the second vertical channel part is conducted.

In some cases, one gate structure is provided on each of two side surfaces of the width side of the vertical channel region, the two device unit structures share the same vertical channel region, and the two device unit structures that share the same vertical channel region form a device unit combination structure.

In some cases, an area between the two gate structures in the device unit combination structure forms a first trench, a bottom surface of the first trench exposes the top surface of the semiconductor substrate, and the first epitaxial layer is a selective epitaxial layer grown from bottom to top on the top surface of the semiconductor substrate exposed from the bottom surface of the first trench.

In some cases, the semiconductor substrate includes a silicon substrate.

In some cases, the first epitaxial layer includes a silicon epitaxial layer.

In some cases, the first gate dielectric layer includes a gate oxide layer.

In some cases, the selection gate is a polysilicon gate or a metal gate.

In some cases, the second gate storage dielectric layer includes an ONO layer or an ANO layer, the ONO layer includes an oxide layer, a nitride layer and an oxide layer which are sequentially stacked, and the ANO layer includes aluminum oxide, a nitride layer and an oxide layer which are sequentially stacked.

In some cases, the storage gate is a polysilicon gate or a metal gate.

In some cases, a source region heavily doped in a first conductive type is formed in a surface area of the semiconductor substrate at a bottom of the vertical channel region;

- a drain region heavily doped in the first conductive type is formed in a surface area of a top of the vertical channel region.

In some cases, the device unit structure is an N-type device, the first conductive type is an N type and the second conductive type is a P type; or the device unit structure is a P-type device, the first conductive type is a P type and the second conductive type is an N type.

In some cases, the material of the first dielectric layer includes an oxide layer.

In some cases, the material of the second dielectric layer includes an oxide layer.

In some cases, the second dielectric layer extends to a position between the first gate dielectric layer and the second gate storage dielectric layer.

In some cases, the first dielectric layer extends to a bottom of the first gate dielectric layer and extends to a position between the vertical channel region and the semiconductor substrate at an edge position.

In this application, the vertical channel region is provided and the gate structures are provided on the side surfaces of the vertical channel region. This structure facilitates the reduction of the size of the device. The vertical channel region can be formed in the trench between the two gate structures through self-alignment, thus further reducing the size of the device. Therefore, this application can facilitate the miniaturization of the device.

In this application, the storage gate is located at the top of the selection gate, and the charges are stored through the second gate storage dielectric layer between the storage gate and the vertical channel region. Compared with the storage layer, which is located at the bottom area of the gate structure, of the floating gate or SONOS of the existing one-dimensional non-volatile memory, the second gate storage dielectric layer in this application is located at the top area. This structure facilitates operating the charges stored in the second gate storage dielectric layer, thus improving the programming and erasing speed, improving the reading speed and reducing the working voltage.

By using the second gate storage dielectric layer located on the side surface of the top area of the vertical channel region as the charge storage layer, this application can also improve the storage stability and service life.

In this application, the vertical channel region is located at the top of the semiconductor substrate, which can facilitate the reduction of the size of the vertical channel region, reduce the parasitic effect, and further improve the performance of the device.

BRIEF DESCRIPTION OF THE DRAWINGS

This application will be further described below in detail in combination with the embodiments with reference to the drawings.

FIG. 1 illustrates a structural diagram of a non-volatile memory according to an embodiment of this application.

DETAILED DESCRIPTION OF THIS APPLICATION

Referring to FIG. 1, it illustrates a structural diagram of a non-volatile memory according to an embodiment of this application. A device unit structure 100 of the non-volatile memory according to this embodiment of this application includes a vertical channel region 102 and a gate structure.

The vertical channel region 102 is composed of a first epitaxial layer formed on a top surface of a semiconductor substrate 101. The vertical channel region is doped in a second conductive type.

In this embodiment of this application, the semiconductor substrate 101 includes a silicon substrate.

The first epitaxial layer includes a silicon epitaxial layer.

The gate structure covers one of two side surfaces of a width side of the vertical channel region 102.

The gate structure includes a selection gate 103 and a storage gate 104.

The selection gate 103 and the vertical channel region 102 are spaced apart by a first gate dielectric layer 105. The selection gate 103 and the semiconductor substrate 101 at a bottom are spaced apart by a first dielectric layer.

The storage gate 104 is located at a top of the selection gate 103. The storage gate 104 and the selection gate 103 are spaced apart by a second dielectric layer 108.

The storage gate 104 and the vertical channel region 102 are spaced apart by a second gate storage dielectric layer 106. The second gate storage dielectric layer 106 has a charge storage function and forms a storage bit. The second gate storage dielectric layer 106 is located at a top of the first gate dielectric layer 105.

In this embodiment of this application, the material of the first dielectric layer 107 includes an oxide layer.

The material of the second dielectric layer 108 includes an oxide layer.

The second dielectric layer 108 extends to a position between the first gate dielectric layer 105 and the second gate storage dielectric layer 106.

The first dielectric layer 107 extends to a bottom of the first gate dielectric layer 105 and extends to a position between the vertical channel region 102 and the semiconductor substrate 101 at an edge position.

A surface of the vertical channel region 102 covered by the gate structure is used for forming a vertical channel. The vertical channel is composed of a first vertical channel part and a second vertical channel part. The first vertical channel part is controlled by the selection gate 103. The second vertical channel part is controlled by the storage gate 104. In a case that charges are stored in the second gate storage dielectric layer 106, the storage bit is '0' and the second vertical channel part is disconnected. In a case that the charges stored in the second gate storage dielectric layer 106 are erased, the storage bit is '1' and the second vertical channel part is conducted.

In this embodiment of this application, one gate structure is provided on each of two side surfaces of the width side of the vertical channel region 102. The two device unit structures 100 share the same vertical channel region 102. The two device unit structures 100 that share the same vertical channel region 102 form a device unit combination structure. FIG. 1 illustrates one device unit combination structure.

An area between the two gate structures in the device unit combination structure forms a first trench. A bottom surface of the first trench exposes the top surface of the semiconductor substrate 101. The first epitaxial layer is a selective epitaxial layer grown from bottom to top on the top surface of the semiconductor substrate 101 exposed from the bottom surface of the first trench. The vertical channel region 102 composed of the selective epitaxial layer facilitates improving the process quality of the vertical channel region 102 and reducing the size such as width of the vertical channel region 102, thus improving the device performance.

In this embodiment of this application, the first gate dielectric layer 105 is a gate oxide layer. In other embodiments, the first gate dielectric layer 105 may also be any other dielectric layer as needed.

The selection gate 103 is a polysilicon gate. In other embodiments, the selection gate 103 may also be a metal gate.

In this embodiment of this application, the second gate storage dielectric layer 106 is an ANO layer, and the storage gate 104 is a metal gate. In this way, a BE-MANOS storage structure is formed by the silicon in the vertical channel region 102, the ANO layer, and the metal gate, where BE represents energy level engineering, and MANOS are respectively abbreviations of English letters corresponding to Metal gate, ANO layer, and Silicon in the vertical channel region 102. This structure can achieve charge storage.

In other embodiments, the second gate storage dielectric layer 106 may also be an ONO layer, which includes an oxide layer, a nitride layer and an oxide layer which are sequentially stacked.

In this embodiment of this application, a source region heavily doped in a first conductive type is formed in a surface area of the semiconductor substrate 101 at a bottom of the vertical channel region 102.

A drain region heavily doped in the first conductive type is formed in a surface area of a top of the vertical channel region 102.

The device unit structure 100 is an N-type device, the first conductive type is an N type and the second conductive type is a P type. In other embodiments, the device unit structure 100 may be a P-type device, the first conductive type is a P type and the second conductive type is an N type.

In this embodiment of this application, the vertical channel region 102 is provided and the gate structures are provided on the side surfaces of the vertical channel region 102. This structure facilitates the reduction of the size of the device. The vertical channel region 102 can be formed in the trench between the two gate structures through self-alignment, thus further reducing the size of the device. Therefore, this embodiment of this application can facilitate the miniaturization of the device.

In this embodiment of this application, the storage gate 104 is located at the top of the selection gate 103, and the charges are stored through the second gate storage dielectric layer 106 between the storage gate 104 and the vertical channel region 102. Compared with the storage layer, which is located at the bottom area of the gate structure, of the floating gate or SONOS of the existing one-dimensional non-volatile memory, the second gate storage dielectric layer 106 in this embodiment of this application is located at the top area. This structure facilitates operating the charges stored in the second gate storage dielectric layer 106, thus improving the programming and erasing speed, improving the reading speed and reducing the working voltage.

By using the second gate storage dielectric layer 106 located on the side surface of the top area of the vertical channel region 102 as the charge storage layer, this embodiment of this application can also improve the storage stability and service life.

In this embodiment of this application, the vertical channel region 102 is located at the top of the semiconductor substrate 101, which can facilitate the reduction of the size of the vertical channel region 102, reduce the parasitic effect, and further improve the performance of the device.

This application has been described above in detail through the specific embodiments, which, however, do not constitute limitations to this application. Without departing from the principle of this application, those skilled in the art may also make many modifications and improvements, which should also be considered as included in the scope of protection of this application.

What is claimed is:

1. A non-volatile memory, wherein a device unit structure comprises a vertical channel region and a gate structure;

the vertical channel region is composed of a first epitaxial layer formed on a top surface of a semiconductor substrate, and the vertical channel region is doped with a second conductive type dopant;

the gate structure covers one of two side surfaces of a width side of the vertical channel region;

the gate structure comprises a selection gate and a storage gate;

the selection gate and the vertical channel region are spaced apart by a first gate dielectric layer, and the selection gate and the semiconductor substrate at a bottom are spaced apart by a first dielectric layer;

the storage gate is located at a top of the selection gate, and the storage gate and the selection gate are spaced apart by a second dielectric layer;

the storage gate and the vertical channel region are spaced apart by a second gate storage dielectric layer, the second gate storage dielectric layer has a charge storage function and forms a storage bit, and the second gate storage dielectric layer is located at a top of the first gate dielectric layer;

a surface of the vertical channel region covered by the gate structure is used for forming a vertical channel, the vertical channel is composed of a first vertical channel part and a second vertical channel part, the first vertical channel part is controlled by the selection gate, and the second vertical channel part is controlled by the storage gate; in a case that charges are stored in the second gate storage dielectric layer, the storage bit is '0' and the second vertical channel part is disconnected; and in a case that the charges stored in the second gate storage dielectric layer are erased, the storage bit is '1' and the second vertical channel part is connected.

2. The non-volatile memory according to claim 1, wherein one gate structure is provided on each of two side surfaces of the width side of the vertical channel region, two device unit structures share the same vertical channel region, and the two device unit structures that share the same vertical channel region form a device unit combination structure.

3. The non-volatile memory according to claim 2, wherein an area between two gate structures in the device unit combination structure forms a first trench, a bottom surface of the first trench exposes the top surface of the semiconductor substrate, and the first epitaxial layer is a selective epitaxial layer grown from bottom to top on the top surface of the semiconductor substrate exposed from the bottom surface of the first trench.

4. The non-volatile memory according to claim 1, wherein the semiconductor substrate comprises a silicon substrate.

5. The non-volatile memory according to claim 4, wherein the first epitaxial layer comprises a silicon epitaxial layer.

6. The non-volatile memory according to claim 5, wherein the first gate dielectric layer comprises a gate oxide layer.

7. The non-volatile memory according to claim 6, wherein the selection gate is a polysilicon gate or a metal gate.

8. The non-volatile memory according to claim 5, wherein the second gate storage dielectric layer comprises an ONO layer or an ANO layer, the ONO layer comprises an oxide layer, a nitride layer, and an oxide layer which are sequentially stacked, and the ANO layer comprises aluminum oxide, a nitride layer, and an oxide layer which are sequentially stacked.

9. The non-volatile memory according to claim 8, wherein the storage gate is a polysilicon gate or a metal gate.

10. The non-volatile memory according to claim 1, wherein a source region heavily doped with a first conductive type dopant is formed in a surface area of the semiconductor substrate at a bottom of the vertical channel region; and a drain region heavily doped with the first conductive type dopant is formed in a surface area of a top of the vertical channel region.

11. The non-volatile memory according to claim 10, wherein the device unit structure is an N-type device, the first conductive type is an N type, and the second conductive type is a P type; or the device unit structure is a P-type device, the first conductive type is a P type, and the second conductive type is an N type.

12. The non-volatile memory according to claim 1, wherein a material of the first dielectric layer comprises an oxide layer.

13. The non-volatile memory according to claim 1, wherein a material of the second dielectric layer comprises an oxide layer.

14. The non-volatile memory according to claim 1, wherein the second dielectric layer extends to a position between the first gate dielectric layer and the second gate storage dielectric layer.

15. The non-volatile memory according to claim 1, wherein the first dielectric layer extends to a bottom of the first gate dielectric layer and extends to a position between the vertical channel region and the semiconductor substrate at an edge position.

* * * * *